US009600359B2

(12) United States Patent
Udipi et al.

(10) Patent No.: US 9,600,359 B2
(45) Date of Patent: Mar. 21, 2017

(54) LOCAL ERROR DETECTION AND GLOBAL ERROR CORRECTION

(75) Inventors: Aniruddha Nagendran Udipi, Austin, TX (US); Naveen Muralimanohar, Santa Clara, CA (US); Norman Paul Jouppi, Palo Alto, CA (US); Alan Lynn Davis, Salt Lake City, UT (US); Rajeev Balasubramonian, Sandy, UT (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 136 days.

(21) Appl. No.: 14/396,327

(22) PCT Filed: May 31, 2012

(86) PCT No.: PCT/US2012/040108
§ 371 (c)(1),
(2), (4) Date: Oct. 22, 2014

(87) PCT Pub. No.: WO2013/180714
PCT Pub. Date: Dec. 5, 2013

(65) Prior Publication Data
US 2015/0082122 A1     Mar. 19, 2015

(51) Int. Cl.
*G11C 29/00* (2006.01)
*G06F 11/10* (2006.01)
*G11C 29/04* (2006.01)

(52) U.S. Cl.
CPC ...... *G06F 11/1064* (2013.01); *G06F 11/1012* (2013.01); *G06F 11/1044* (2013.01); *G06F 11/108* (2013.01); *G11C 2029/0411* (2013.01)

(58) Field of Classification Search
None
See application file for complete search history.

(56) References Cited

U.S. PATENT DOCUMENTS 4,875,212 A    10/1989   Hashimoto
6,249,475 B1    6/2001   Atwell et al.
(Continued)

FOREIGN PATENT DOCUMENTS

CN          101681283      3/2010
EP          2261806 A1   12/2010
(Continued)

OTHER PUBLICATIONS

Energy Efficient DRAM Micro-architecture with Error Detection Support for Low-cost Chipkill~iBridge (SM) Network~Apr. 2012~2 pages.
(Continued)

*Primary Examiner* — Daniel McMahon
(74) *Attorney, Agent, or Firm* — Hewlett Packard Enterprise Patent Department

(57) ABSTRACT

An example system in accordance with an aspect of the present disclosure is to use local error detection (LED) and global error correction (GEC) information to check data fidelity and correct an error. The LED is to be calculated per cache line segment of data associated with a rank of a memory. Data fidelity may be checked in response to a memory read operation, based on the LED information, to identify a presence of an error and the location of the error among cache line segments of the rank. The cache line segment having the error may be corrected based on the GEC information, in response to identifying the error.

15 Claims, 6 Drawing Sheets

(56) References Cited

U.S. PATENT DOCUMENTS

| | | |
|---|---|---|
| 6,584,595 B2 | 6/2003 | Cypher |
| 7,308,638 B2 * | 12/2007 | Nerl ............... G06F 11/1012 714/763 |
| 7,437,651 B2 * | 10/2008 | Nerl ............... G06F 11/1012 714/767 |
| 7,636,880 B2 | 12/2009 | Foss |
| 7,856,528 B1 | 12/2010 | Frost |
| 7,996,727 B2 | 8/2011 | Radke |
| 8,055,982 B2 | 11/2011 | Mulligan |
| 8,086,783 B2 | 12/2011 | O'Connor et al. |
| 2001/0014039 A1 | 8/2001 | Longwell et al. |
| 2002/0069317 A1 * | 6/2002 | Chow ............... G06F 3/0611 711/104 |
| 2004/0225944 A1 * | 11/2004 | Brueggen ......... G06F 11/1064 714/758 |
| 2005/0015649 A1 | 1/2005 | Lee et al. |
| 2005/0172207 A1 | 8/2005 | Radke et al. |
| 2006/0143551 A1 | 6/2006 | Biswas et al. |
| 2006/0236035 A1 * | 10/2006 | Barlow ............ G06F 11/0733 711/118 |
| 2009/0006886 A1 | 1/2009 | O'Connor et al. |
| 2009/0006900 A1 | 1/2009 | Lastras-Montano et al. |
| 2009/0019321 A1 | 1/2009 | Radke |
| 2010/0027336 A1 | 2/2010 | Park et al. |
| 2010/0037117 A1 * | 2/2010 | Pescatore ......... G06F 11/1044 714/752 |
| 2010/0299576 A1 * | 11/2010 | Baysah ............ G06F 11/1044 714/763 |
| 2010/0325522 A1 | 12/2010 | Tsukamoto et al. |
| 2011/0231737 A1 | 9/2011 | Dachiku |
| 2011/0283164 A1 | 11/2011 | Tang et al. |
| 2012/0079318 A1 | 3/2012 | Colgrove |
| 2013/0007542 A1 * | 1/2013 | Carman ............ G06F 11/106 714/710 |

FOREIGN PATENT DOCUMENTS

| | | |
|---|---|---|
| JP | 2005293728 | 10/2005 |
| TW | 1308760 | 4/2009 |

OTHER PUBLICATIONS

PCT Search Report/Written Opinion~Application No. PCT/US2012/0410108 dated Feb. 1, 2013~9 pages.

Udipi, et al., "Rethinking DRAM Design and Organization for Energy-Constrained Multi-Cores," ISCA 10, Jun. 19-23, 2010.

Yoon, et al., "Virtualized and Flexible ECC for Main Memory," ASPLOS10, Mar. 13-17, 2010.

* cited by examiner

LOCAL ERROR DETECTION AND GLOBAL ERROR CORRECTION

BACKGROUND

Memory system reliability is a serious and growing concern in modern servers and blades. Existing memory protection mechanisms require one or more of the following: activation of a large number of chips on every memory access, increased access granularity, and an increase in storage overhead. These lead to increased dynamic random access memory (DRAM) access times, reduced system performance, and substantially higher energy consumption. Current commercial chipkill-level reliability mechanisms may be based on conventional Error-Correcting Code (ECC) such as Reed-Solomon (RS)-codes, symbol based codes etc. However, current ECC codes restrict memory system design to use of x4 DRAMs. Further, for a given capacity, dual in-line memory modules (DIMMs) with narrow chips (i.e., I/O DRAM x4 chips) consume more energy than those with wider I/O chips (i.e., x8, x16, or x32 chips).

This non-availability of efficient chipkill mechanisms is one reason for the lack of adoption of wide input/output (I/O) DRAMs despite the advantages they offer. Second, current ECC codes are computed over large data words to increase coding efficiency. This EGG code handling results in large access granularities, activating a large number of chips or even ranks for every memory operation, and increased energy consumption. Area, density, and cost constraints can lead to overfetch to some extent within a rank of chips, but imposing additional inefficiency in order to provide fault tolerance should be avoided. The handling may potentially reduce bank-level and rank-level parallelism, which diminishes the ability of DRAM to supply data to high bandwidth I/O such as photonic channels. Finally, conventional ECC codes employ complex Galois field arithmetic that is inefficient in terms of both latency and circuit area.

BRIEF DESCRIPTION OF THE DRAWINGS/FIGURES

DETAILED DESCRIPTION

Examples described herein can use a two-tier protection scheme that separates out error detection and error correction functionality. Codes, such as those based on checksum and parity, can be used effectively to provide strong fault-tolerance with little or no overhead. Storage, such as system firmware, may be used to direct a memory controller to store some correction codes in DRAM data memory. The memory controller may be modified to handle data mapping, error detection, and correction. Novel application of error detection/correction codes, and novel physical data mapping to memory, can allow a commodity memory module (e.g., ECC DIMM x4, x8, x16, x32 etc.) to provide chipkill functionality without increasing the fetch width and/or the storage overhead. Further, locality and DRAM row buffer hit rates may be further improved by placing the data and the ECC codes in the same row buffer. Thus, an effective fault-tolerance mechanism is provided, enabling strong reliability guarantees, activating as few chips as possible to conserve energy and improve performance, reducing circuit complexity, and working with wide I/O DRAM chips such as x8, x16, or x32.

Figure 1:
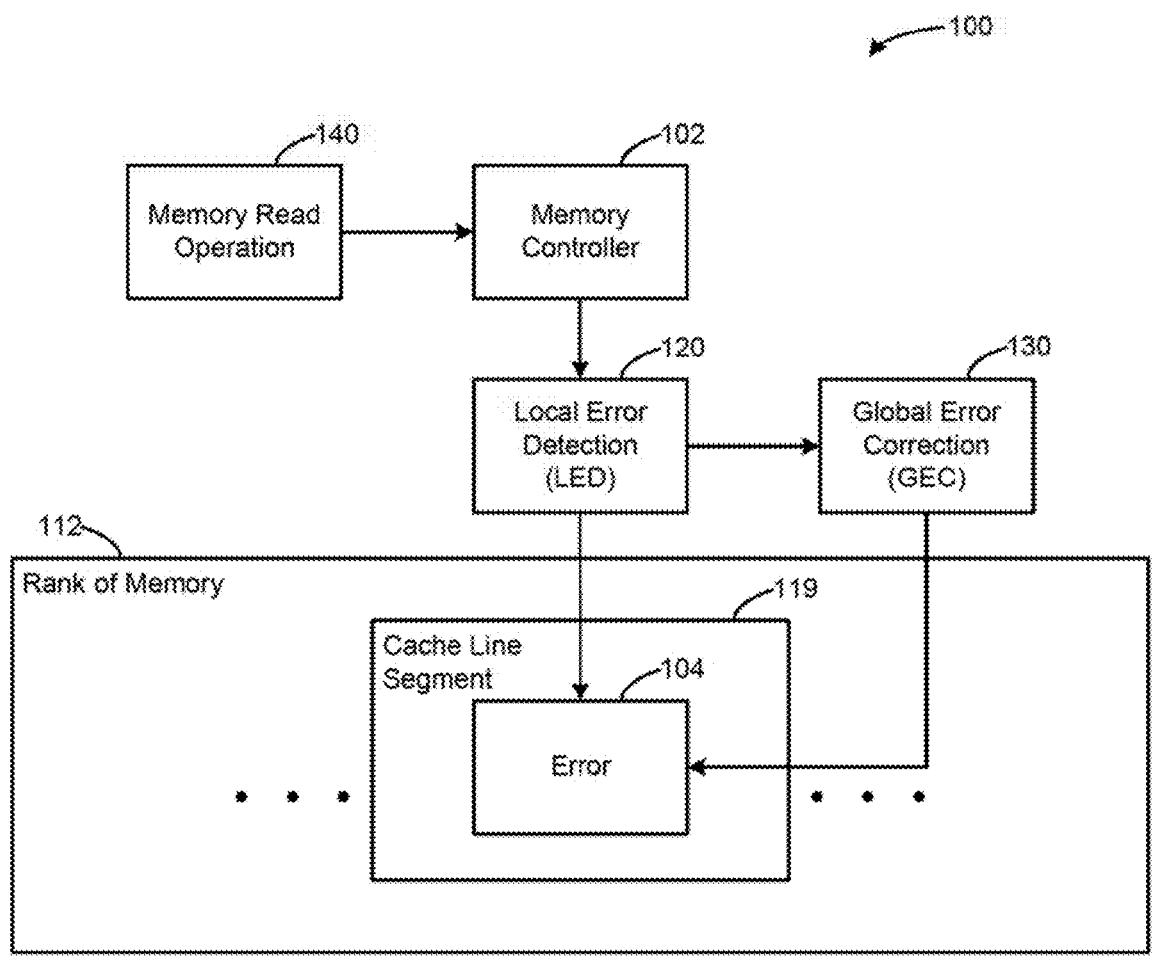
FIG. 1 is a block diagram of a system including a memory controller according to an example.

FIG. 1 is a block diagram of a system 100 including a memory controller 102 according to an example. System 100, in response to a memory read operation 140, is to apply local error detection 120 and/or global error correction 130 to detect and/or correct an error 104 of a cache line segment 119 of a rank 112 of memory.

In an example, system 100 is to compute local error detection (LED) 120 information per cache line segment 119 of data. The cache line segment 119 is associated with a rank 112 of memory. The LED 120 is to be computed based on an error detection code. The system 100 is to generate a global error correction (GEC) for the cache line segment, based on a global parity. The system 100 is to check data fidelity in response to memory read operation 140, based on the LED 120 information, to identify a presence of an error 104 and the location of the error 104 among cache line segments 119 of the rank 112. The system 100 is to correct the cache line segment 119 having the error 104 based on the GEC, in response to identifying the error 104.

In an alternate example, system 100 is to perform local error detection (LED) 120 in response to a memory read operation 140, based on a checksum computed over a cache line segment 119, to detect a location of an error 104 at a chip-granularity among N data chips in a rank 112. The system 100 is to perform global error correction (GEC) 130 over the cache line segment 119 on the N data chips in the rank 112 in response to detecting the error 104. The system 100 is to perform the GEC 130 using a global parity to generate GEC information, and reconstruct data segments 119 having the error 104, based on error-free segments and the GEC information.

Thus, system 100 may use simple checksums and parity operations to build a two-layer fault tolerance mechanism, at a level of granularity down to a segment 119. The first layer of protection is local error detection (LED) 120, a check (e.g., an immediate check that follows a read operation 140) to verify data fidelity. The LED 120 can provide chip-level error detection (for chipkill, i.e., the ability to withstand the failure of an entire DRAM chip), by distributing LED information 120 across a plurality of chips in a memory module. Thus, the LED information 120 may be associated, not only with each cache line as a whole, but with every cache line "segment," i.e., the fraction of the line present in a single chip in the rank.

A relatively short checksum (1's complement, Fletcher's sums, or other) may be used as the error detection code, and may be computed over the segment and appended to the data. The error detection code may be based on other types of error detection and/or error protection codes, such as cyclic redundancy check (CRC), Bose, Ray-Chaudhuri, and Hocquenghem (BCH) codes, and so on. This error detection code may be stored in the same memory row, or in a different row to contain such LED information for several cache lines. The layer-1 protection (LED 120) may not only detect the presence of an error, but also pinpoint a location of the error, i.e., locate the chip or other location information associated with the error 104.

If the LED 120 detects an error, the second layer of protection may be applied, the Global Error Correction (GEC) 130. The GEC 130 may be based on a parity, such as an XOR-based global parity across the data segments 119 on the N data chips in the rank 112. The GEC 130 also may be based on other error detection and/or error protection codes, such as CRC, BCH, and others. The GEC results may be stored in either the same row as the data segments, or in a separate row that is to contain GEC information for several data rows. Data may be reconstructed based on reading out the fault-free segments and the GEC segment, and location information (e.g., an identification of the failed chip based on the LED 120).

The LED 120 and GEC 130 may be computed over the data words in a single cache line. Thus, when a dirty line is to be written back to memory from the processor, there is no need to perform a "read-before-write," and both codes can be computed directly, thereby avoiding impacts to write performance. Furthermore, LED 120 and/or GEC 130 may be stored in regular data memory, in view of a commodity memory system that may provide limited redundant storage for Error-Correcting Code (ECC) purposes. An additional read/write operation may be used to access this information along with the processor-requested read/write. Storing LED information in the provided storage space within each row may enable it to be read and written in tandem with the data line. GEC information can be stored in data memory in a separate cache line since it can be accessed in the very rare case of an erroneous data read. Appropriate data mapping can locate this in the same row buffer as the data to increase locality and hit rates.

The memory controller 102 may provide data mapping, LED 120/GEC 130 computation and verification, perform additional reads if required, etc. Thus, system 100 may provide full functionality transparently, without a need to notify and/or modify an Operating System (OS) or other computing system components. Setting apart some data memory to store LED 120/GEC 130 may be handled through minor modifications associated with system firmware, e.g., reducing a reported amount of available memory storage to accommodate the stored LED 120/GEC 130 transparently from the OS and application perspective.

Figure 2:
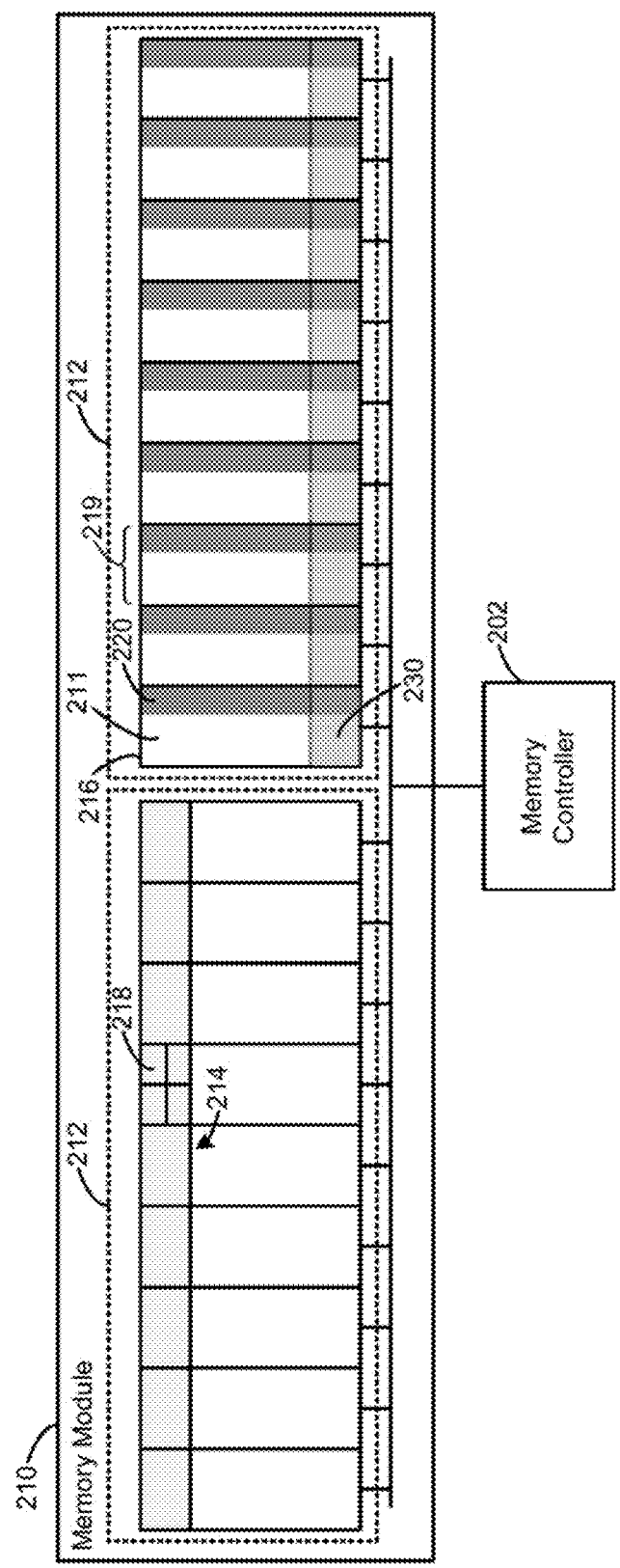
FIG. 2 is a block diagram of a memory module according to an example.

FIG. 2 is a block diagram of a memory module 210 according to an example. The memory module 210 may interface with memory controller 202. The memory module 210 may be a Joint Electron Devices Engineering Council (JEDEC)-style double data rate (DDRx, where x=1, 2, 3, . . . ) memory module, such as a Synchronous Dynamic Random Access Memory (SDRAM) configured as a dual in-line memory module (DIMM). Each DIMM may include at least one rank 212, and a rank 212 may include a plurality of DRAM chips 216. Two ranks 212 are shown, each rank 212 including nine chips 216. A rank 212 may be divided into multiple banks 214, each bank distributed across the chips 216 in a rank 212. Although one bank 214 is shown spanning the chips in the rank, a rank may be divided into, e.g., 4-16 banks. The portion of each rank 212/bank 214 in a chip 216 is a segment 219. When the memory controller 202 issues a request for a cache line, the chips 216 in the rank 212 are activated and each segment 219 contributes a portion of the requested cache line. Thus, a cache line is striped across multiple chips 216.

In an example having a data bus width of 64 bits, and a cache line of 64 bytes, the cache line transfer can be realized based on a burst of 8 data transfers. A chip may be an ×N part, e.g., ×4, ×8, ×16, ×32, etc. Each segment of a bank 214 may be partitioned into N arrays 218 (four are shown). Each array 218 can contribute a single bit to the N-bit transfer on the data I/O pins for that chip 216. Thus, for a given DIMM capacity, employing wider I/O DRAM parts such as ×8, ×16, or ×32 may decrease the number of DRAM chips 216 needed to achieve a given data bus width, creating extra space on the DIMM for more chips 216, thereby increasing the number of independent banks 214 available.

Each chip 216 may be used to store data 211, information from LED 220, and information from GEC 230. Accordingly, each chip 216 may contain a segment 219 of data 211, LED 220, and GEC 230 information. This is in contrast to how a conventional 9-chip ECC memory module is used, where 8 chips are used for data and the $9^{th}$ chip is used for ECC information. Accordingly, the exemplary uses described herein provide robust chipkill protection, because each chip can include the data 211, LED 220, and GEC 230 for purposes of identifying and correcting errors. The example of FIG. 2 illustrates functionality with just a single rank of nine ×8 chips, improving access granularity, energy consumption, and performance. Further, the example can support chipkill protection at very high ratios, such as the ability to handle 1 dead chip in 9, significantly boosting reliability guarantee (in contrast to conventional support of, e.g., 1 dead chip in 36).

Examples described herein can allow several-fold reduction in the number of chips activated per memory access. This helps reduce dynamic energy consumption by eliminating overfetch at least to that extent, and helps reduce static energy consumption by allowing unused chips to be put in low-power modes. In addition to the energy advantages, reducing access granularity increases rank-level and bank-level parallelism. This enables substantial performance gains. Examples described herein impose no restrictions on DRAM parts, DIMM layout, DDR protocol, burst length, etc., and may be adapted to ×8, ×16 or ×32 DRAMs, allowing servers to exploit advantages of those memory configurations. Examples may be achieved with non-intrusive modifications to system designs, because an example memory controller, and to a smaller extent a memory firmware, may be modified to provide support for the examples. Examples may utilize additive checksums and parity calculations to provide strong fault tolerance without a need for Galois field arithmetic over 16-bit or 32-bit symbols or other increased complexity, latency, and energy consumption.

Thus, examples herein provide benefits without a need for a specially designed DRAM chip microarchitecture, e.g., a DRAM having a special area provisioned to store ECC information and utilizing a localized data mapping architecture that would impose significant penalties on write performance if chipkill-level reliability is enabled. Further, there is no need for using conventional symbol-based ECC codes that have constraints with respect to DIMM and rank organization. Examples are implementation friendly, without a need for modifications to several components of a computing system, because examples may be transparent to a computing system's operating system, memory management unit, caches, etc.

Figure 3:
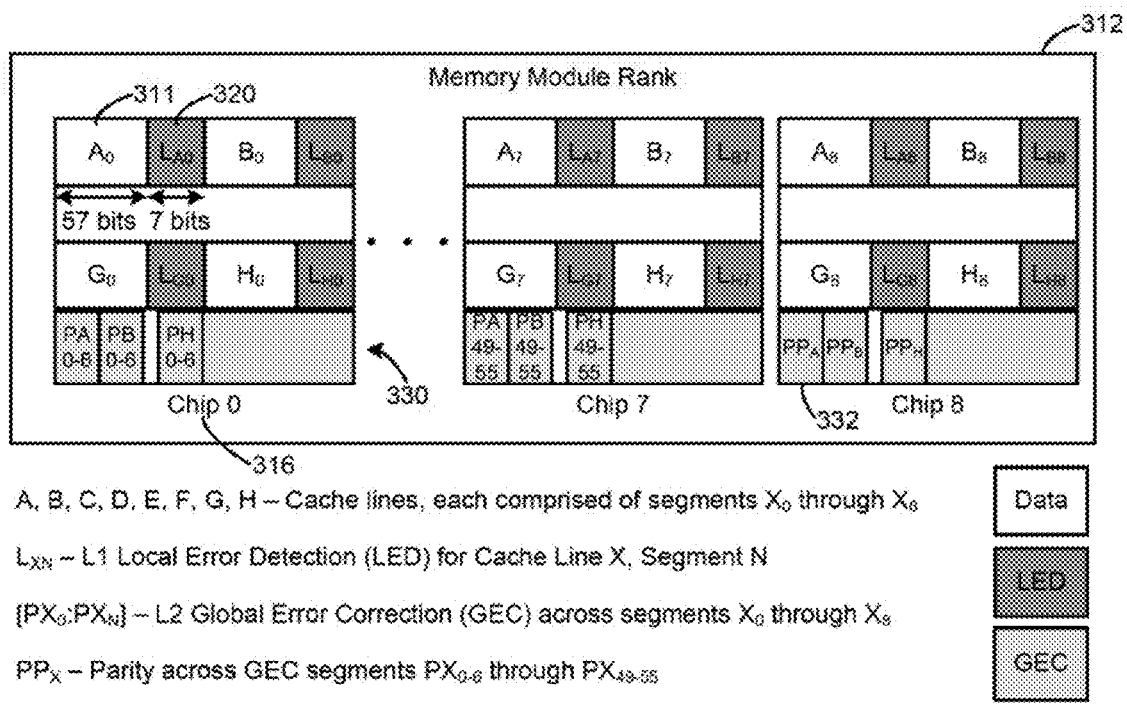
FIG. 3 is a block diagram of a memory module rank according to an example.

FIG. 3 is a block diagram of a memory module rank 312 according to an example. The rank 312 may include N chips, e.g., nine ×8 DRAM chips 316 (chip 0 chip 8), and a burst length of 8. In alternate examples, other numbers/combinations of N chips may be used, at various levels of ×N and burst, lengths. The data 311, LED 320, and GEC 330 can be distributed throughout the chips 316 of the rank 312.

LED 320 can perform an immediate check following every read operation to verify data fidelity. Additionally, LED 320 can identify a location of the failure, at a chip-granularity within rank 312. To ensure such chip-level detection (usable for chipkill), the LED 320 can be maintained at the chip level—associated with more specificity than an entire cache line as a whole (as in symbol-based ECC codes), at every cache line "segment," the fraction of the line present in a single chip 316 in the rank 312. Cache line A is divided into segments $A_0$ through $A_8$, with the associated local error detection codes $L_{A0}$ through $L_{A8}$.

A cache line may be associated with 64 bytes of data, or 512 data bits, associated with a data operation, such as a memory request. Because 512 data bits (one cache line) in total are needed, each chip is to provide 57 bits towards the cache line. An ×8 chip with a burst length of 8 supplies 64 bits per access, which are interpreted as 57 bits of data ($A_0$ in FIG. 3, for example), and 7 bits of LED information 320 associated with those 57 bits ($L_{A0}$). A physical data mapping policy may be used to ensure that LED bits 320 and the data segments 311 they protect are located on the same chip 316. One bit of memory appears to remain unused for every 576 bits, since 57 bits of data multiplied by 9 chips is 513 bits, and only 512 bits are needed to store the cache line. However, this "surplus bit" is used as part of the second layer of protection (e.g., GEC) details of which are described in reference to FIG. 4.

There are no performance penalties on either reads or writes due to the LED code 320. Every cache line access also reads/writes its corresponding LED information. Since the LED 320 is "self-contained," i.e., it is constructed from bits belonging to exactly one cache line, no read-before-write is needed—all bits used to build the code are already at the memory controller before a write. The choice of error detection code for the LED 320 can depend on an expected failure mode. For example, a simple 1's complement addition checksum may be used for a range of expected failure modes, including the most common/frequent modes of memory failure.

The GEC 330, also referred to as a Layer 2. Global Error Correction code, is to aid in the recovery of lost data once the LED 320 (Layer 1 code) detects an error and indicates a location of the error. The Layer 2 GEC 330 may be comprised of three tiers. The GEC 330 code may be a 57-bit entity, and may be provided as a column-wise XOR parity of nine cache line segments, each a 57-bit field from the data region. For cache line A, for example, its GEC 330 may be a parity, such as a parity PA that is a XOR of data segments $A_0, A_1, \ldots, A_8$. Data reconstruction from the GEC 330 code may be a non-resource intensive operation (e.g., an XOR of the error-free segments and the GEC 330 code), as the erroneous chip 316 can be flagged by the LED 320. Because there isn't a need for an additional dedicated ECC chip (what is normally used as an ECC chip on a memory module rank 312 is instead used to store data+LED 320), the GEC code may be stored in data memory itself, in contrast to using a dedicated ECC chip. The available memory may be made to appear smaller than it physically is (e.g., by 12.5% overhead for storing LED 320 and/or GEC 330) from the perspective of the operating system, via firmware modifications or other techniques. The memory controller also may be aware of the changes to accommodate the LED 320 and/or GEC 330, and may map data accordingly (such as mapping to make the LED 320 and/or GEC 330 transparent to the OS, applications, etc.).

In order to provide strong fault-tolerance of one dead chip 316 in nine for chipkill, and to minimize the number of chips 316 touched on each access, the GEC 330 code may be placed in the same rank as its corresponding cache line. A specially-reserved region (lightly shaded GEC 330 in FIG. 3) in each of the nine chips 316 in the rank 312 may be set aside for this purpose. The specially-reserved region may be a subset of cache lines in every DRAM page (row), although it is shown as a distinct set of rows in FIG. 3 for clarity. This co-location may ensure that any reads or writes to the GEC 330 information will be guaranteed to produce a row-buffer hit when made in conjunction with the read or write to the actual data cache line, thus reducing any potential impacts to performance.

Figure 4:
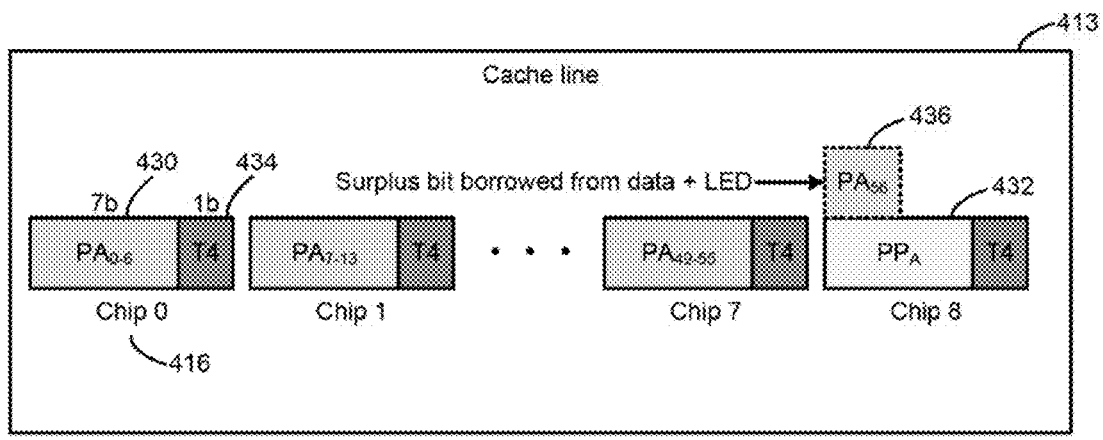
FIG. 4 is a block diagram of a cache line including a surplus bit according to an example.

FIG. 4 is a block diagram of a cache line 413 including a surplus bit 436 according to an example. The GEC 430 information may be laid out in a reserved region across N chips (e.g., Chip 0 . . . 8), for an example as cache line A, also illustrated in FIG. 3. The cache line 413 also may include parity 432, tiered parity 434, and surplus bit 436.

Similar to the data bits as shown in FIG. 3, the 57-bit GEC 430 may be distributed among all N (i.e., nine) chips 419. The first seven bits of the PA field ($PA_{0-6}$) may be stored in the first chip 416 (Chip 0), the next seven bits ($PA_{7-13}$) may be stored in the second chip (Chip 1), and so on. Bits $PA_{49-55}$ may be stored on the eighth chip (Chip 7). The last bit, $PA_{56}$ may be stored on the ninth chip (Chip 8), in the surplus bit 436. The surplus bit 436 may be borrowed from the Data+LED region of the $N^{th}$ chip (Chip 8), as set forth above regarding using only 512 bits of the available 513 bits (57 bits×9 chips) to store the cache line.

The failure of a chip 416 also results in the loss of the corresponding bits in the GEC 430 information stored in that chip. The GEC 430 code PA itself, therefore, is protected by an additional parity 432, also referred to as the third tier $PP_A$. $PP_A$ in the illustrated example is a 7-bit field, and is the XOR of the N−1 other 7-bit fields, $PA_{0-6}, PA_{7-13}, \ldots, PA_{49-55}$. The parity 432 ($PP_A$ field) is shown stored on the $N^{th}$ (ninth) chip (Chip 8). If an entire chip 416 fails, the GEC 430 is first recovered using the parity 432 combined with uncorrupted GEC segments from the other chips. The chips 416 that are uncorrupted may be determined based on the LED, which can include an indication of an error's location, i.e., locate the failed chip). The full GEC 430 is then used to reconstruct the original data.

In addition to a fully failed chip error, there may be an error in a second chip. Examples described herein enable detection, if not correction, of such a failure under the various fault models. If the second error is also a full-chip failure, it will be detected by the LED along with the initial data read, and flagged as a doublechip failure. However, if the second error occurs just in the GEC 430 row of interest, it can be detected during the GEC phase.

In an example failure scenario, assume that the second chip has completely failed—$A_1$, and $PA_{7-13}$ would be lost. If, in addition, there is an error in the GEC region of the first chip, there is a possibility that one or more of the bits $PA_{0-6}$ are corrupt. The reconstruction of lost bits $PA_{7-13}$ from $PP_A$ 432 and $PA_{0-6}, PA_{14-20}, PA_{21-27} \ldots PA_{56}$ may itself be incorrect. To handle this problem, tiered parity 434 is used, e.g., the remaining 9 bits of the nine chips 416 (marked T4, for Tier-4, in FIG. 4) are used to build an error detection code across GEC bits $PA_0$ through $PA_{55}$, and $PP_A$. Note that neither exact error location information nor correction capabilities are required at this stage, because the reliability target is only to detect a second error, and not necessarily correct it. A code, therefore, may be built using various permutations of bits from the different chips to form each of the T4 bits 434. This can include multiple bits from the same chip 416, and bits from different columns across chips 416 to maximize the probability of detection.

In another example, consider a single cache line A. Recall that chips 0-7 (without loss of generality, e.g., N−1 chips) can contain 57 bits of data plus 7 bits of LED in the data region, and 7 bits of GEC 430 parity plus 1 bit of T4 information (tiered parity 434) in the GEC region. Chip-8 (the $N^{th}$ chip) can contain 56 bits of data plus 7 bits of LED plus one surplus bit 436 in the data region, and 8 bits of parity (including the surplus bit borrowed from the data region) plus one bit of T4 information in the GEC region.

If one of the first eight chips, e.g., the second chip, fails, 57 bits of data ($A_1$) are lost, in addition to GEC parity information $PA_{7-13}$. The lost information can be recovered by reading $A_0$-$A_6$, and the LED associated with A1 ($L_{A1}$), indicates a chip error. Read GEC segments $PA_{0-6}$, $PA_{14-20}$, $PA_{21-27}$, ..., $PA_{49-55}$, PAM and PPA to recover the lost GEC bits $PA_{7-13}$, thereby reconstructing GEC parity PA. Combined with values $A_0$ and $A_2$-$A_7$, data value $A_1$ can be reconstructed, thus recovering the entire original cache line. If, however, the ninth chip were to fail, only 56 bits of data would be lost ($A_8$), in addition to $PP_4$, and the surplus bit $PA_{56}$. The lost 56 bits can be recovered from the 56 columns of parity stored in the first eight chips ($PA_{0-55}$), thus recovering the entire original cache line. The loss of surplus bit $PA_{58}$ is immaterial. Across these cases, the fidelity of the GEC parity bits themselves is guaranteed by tiered parity 434 T4.

Read operations need not access GEC 430 information unless an error is detected, which is a rare event. GEC 430 therefore has no significant impact on reads. As for write operations, the GEC 430 may be updated (which includes $P_X$, $PP_X$, and T4) when data is modified. In a baseline implementation, each cache line write may be transformed into two writes—one to the data location (for a full 576 bits of data+LED+surplus bit) and another to its corresponding GEC location (72-bits). Although 72 bits of GEC+T4 code may be updated per write, other constraints (e.g., the DDR3 protocol) may be associated with completing a burst of 8 per access (e.g., an entire 72-byte "cache line" size of data). Thus, updates may be combined, e.g., as many as 8 different GEC updates into a single write command, to reduce some of the performance impact. This is low-overhead since writes are already buffered and streamed out intermittently from the memory controller, and additional logic can easily be implemented at this stage to coalesce as many GEC writes as possible. Performance impact is further minimized because the data mapping ensures that the GEC write is a row-buffer hit once the data line is written. Additionally, note that there is not a need for a read-before-write of the data cache lines themselves, because bits contributing to the GEC code are from a single cache line, already available at the controller. This further minimizes performance impact. If complete coalescing is not implemented (based on the addresses being written to), data masking can be employed to write the appropriate bits into memory. Note that the complete burst of 8 may be performed nonetheless—some pieces of data are just masked out while actually writing to DRAM.

With all these considerations, every write is transformed into 1+δ writes, for some fraction δ<1 dependent on the access characteristics of the application. Note that δ=1 in a non-coalesced baseline implementation, and δ=0.125 in an oracular design because eight GEC words fit in a single "cache line," and could potentially be coalesced into a single write.

In an example implementation for nine chips (N=9), for each 64-byte (512-bit) cache line in a rank with nine ×8 chips, the following bits may be used: 63 bits of LED information, at 7 bits per chip; 57 bits of GEC parity, spread across the nine chips, 7 bits of third-level parity, $PP_X$; and 9 bits of T4 protection, 1 bit per chip. This adds up to a total of 136 bits out of 512 bits of the cache line, a storage overhead of 26.5%. Out of this 26.5%, 12.5% may be provided by the $9^{th}$ chip added on to standard ECC DIMMs (e.g., making the $9^{th}$ chip available for general use, instead of reserving it for standard ECC-only operation), and the other 14% is stored in data memory in the GEC region.

The examples described herein may be applied to wider-I/O DRAM parts, which are associated with greater power efficiency and greater rank-level parallelism. A specific example will be provided for ×16 DRAMs, and similar techniques may be used for extending the concepts to ×32 DRAMs and beyond.

Consider a rank of nine ×16 DRAMs. The 128 bits supplied by an ×16 DRAM in a burst of 8 may be interpreted as 114 data bits and 14 checksum LED bits, having a storage overhead similar to using ×8 DRAMs. GEC operation may remain unchanged. While there may be an increase in access granularity and overfetch, storage overhead may remain constant at approximately 25% (LED+GEC).

If access granularity is fixed at exactly one cache line (i.e., a 64-bit bus), the minimum rank size with ×16 chips is 5 chips (4 data plus 1 ECC). Each chip provides 128 bits per burst of 8, interpreted as 103 data bits (since 103*4 chips=512-bit cache line). This leaves 25 bits per chip to store the LED code, which provides very strong error protection, but may be wasteful of storage area (the overhead would be 24%). GEC overhead may increase as well, because the global parity is a 103-bit entity computed over four 103-bit data segments, a storage overhead of 2 with total overhead of approximately 50%.

If storage overhead is prioritized, it can be fixed at about 12.5%, with a tradeoff of an increase in access granularity. With ×16 chips and a 5-chip rank, for example, 9 reads can be issued consecutively, reading out a total of 80 bits per cycle*burst of 8 cycles*9 accesses=5,760 bits. This results in a very large access granularity of 10 cache lines (5120 bits) plus their LED codes, with a storage overhead of 12.5%. The GEC overhead remains approximately 25% (1 in 4 chips), for an overall ECC storage overhead of 37.5%.

If neither access granularity nor storage overhead is to be compromised, but there is freedom to implement a custom DIMM, the use of heterogeneous DRAMs within a single DIMM rank may be used. In this case, minimum access granularity can be maintained while still retaining a 12.5% storage overhead. With ×16 parts, for instance, a minimum-sized rank would be four ×16 DRAMs plus one ×8 DRAM (note that the DRAMs are still commodity, just not the DIMM), providing a DIMM width of 72 bits. With a burst length of 8, each ×16 DRAM supplies 128 bits and the ×8 DRAM supplies 64 bits. These should be interpreted as (114 data+14 LED) and (56 data+8 LED) respectively. There would be no change to GEC overhead or operation.

Thus, there are several options to be varied, including the storage overhead, the importance of access locality (typically a function of access locality in the workload), and the willingness to build heterogeneous DIMMs—as wide I/O parts such as ×16 or ×32 become mainstream due to their reduced power consumption. Examples described herein are flexible enough to be effective in designs with varying combinations and variations of these options.

Substantial power savings may be realized, compared to traditional chipkill mechanisms, through a reduction of both dynamic and static power. It is possible to activate the absolute minimum number of chips required to service a request, e.g., just nine ×8 chips, for example, reading/writing exactly one 64-byte cache line in a standard 8-burst access. This is in contrast to conventional chipkill solutions that may cause forced prefetching and increase dynamic power consumption (e.g., by activating additional chips per read/write, accessing multiple cache lines per standard 8-burst access). Examples provided herein also may enable a reduction in activate power, because the size of the row buffer per chip may be constant, but fewer chips are being activated. Activation power also may be reduced going from ×4 chips to ×8 chips, because fewer chips make up a rank. The footprint of each activation also may be reduced, allowing unused rank/banks to transition into low-power modes, such as shallow low-power modes that can be entered into and exited from quickly.

In addition to the large energy advantage, reducing access granularity also has a positive effect on performance. For a given total number of chips in the system, there is increased rank-level and bank-level parallelism. This can reduce bank conflicts and overall average memory access latency. A fraction of this gain may be lost due to the extra writes to GEC lines required along with the regular writes. Despite this overhead, examples may still come out ahead, even without coalescing.

Figure 5:
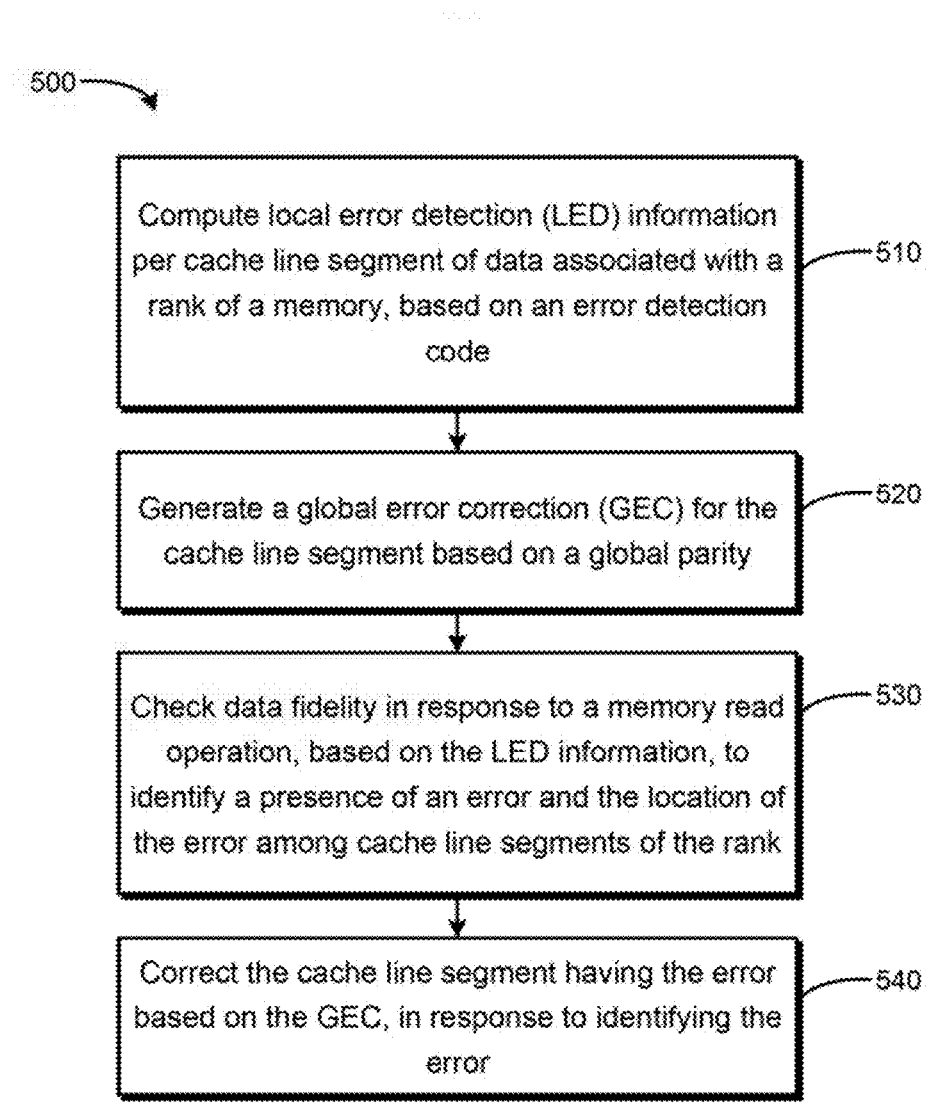
FIG. 5 is a flow chart based on checking data fidelity according to an example.

FIG. 5 is a flow chart 500 based on checking data fidelity according to an example. In block 510, local error detection (LED) information is computed per cache line segment of data associated with a rank of a memory, based on an error detection code. In block 520, a global error correction (GEC) is generated for the cache line segment based on a global parity. In block 530, data fidelity is checked in response to a memory read operation, based on the LED information, to identify a presence of an error and the location of the error among cache line segments of the rank. In block 540, the cache line segment having the error is corrected based on the GEC, in response to identifying the error.

Figure 6:
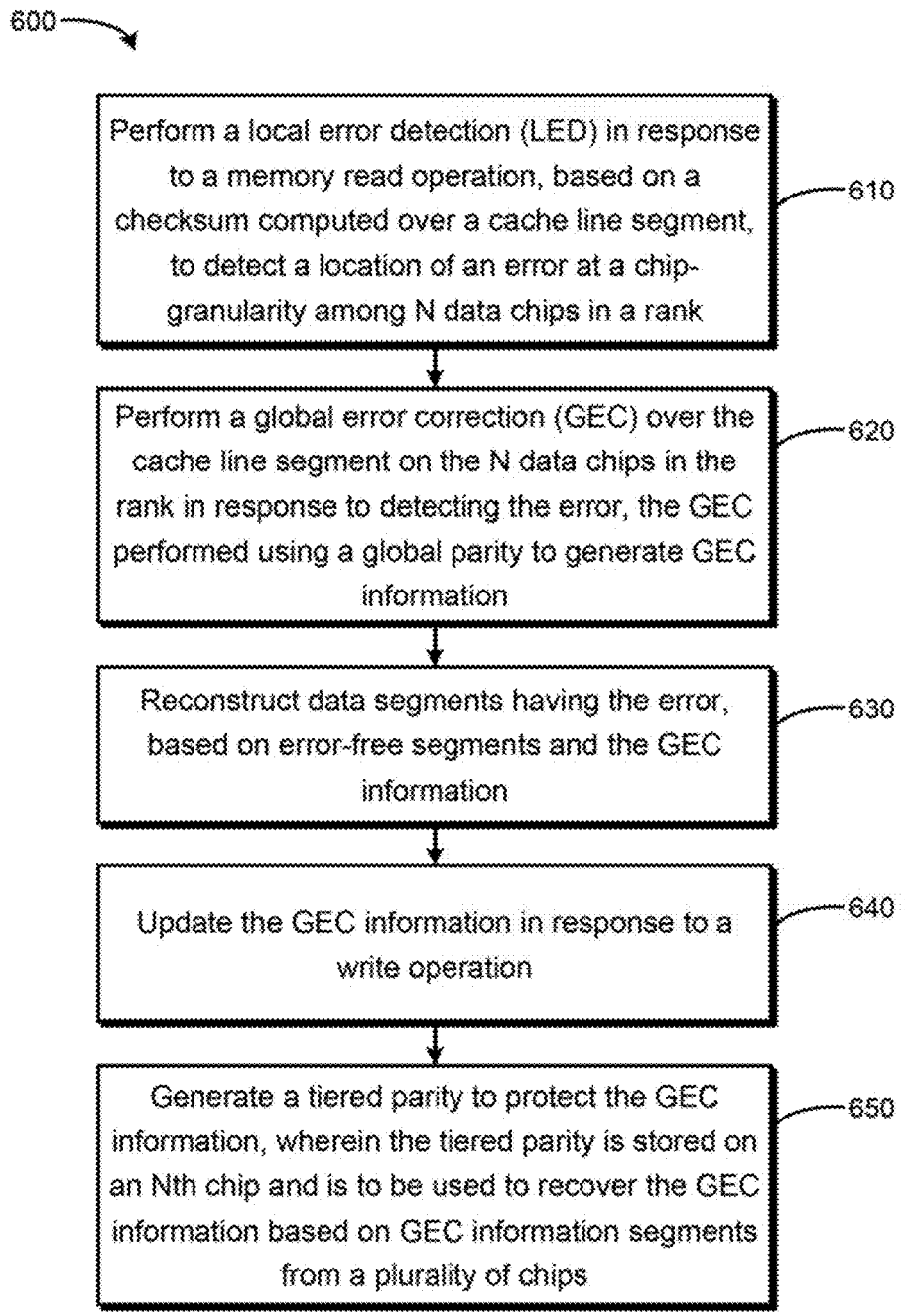
FIG. 6 is a flow chart based on performing error detection and/or correction according to an example.

FIG. 6 is a flow chart 600 based on performing error detection and/or correction according to an example. In block 610, a local error detection (LED) is performed in response to a memory read operation, based on a checksum computed over a cache line segment, to detect a location of an error at a chip-granularity among N data chips in a rank. In block 620, a global error correction (GEC) is performed over the cache line segment on the N data chips in the rank in response to detecting the error, the GEC performed using a global parity to generate GEC information. In block 630, data segments having the error are reconstructed, based on error-free segments and the GEC information. In block 640, the GEC information is updated in response to a write operation. In block 650, a tiered parity is generated to protect the GEC information, wherein the tiered parity is stored on an Nth chip and, is to be used to recover the GEC information based on GEC information segments from a plurality of chips.

What is claimed is:
1. A method, comprising:
computing local error detection (LED) information per cache line segment of data associated with a rank of a memory, based on an error detection code;
generating a global error correction (GEC) information for the cache line segment based on an error correction code;
checking data fidelity in response to each memory read operation, based on the LED information, to identify a presence of an error and an error location, at a given cache line segment, of the error among cache line segments of the rank, along with locations of error-free segments; and
correcting the cache line segment having the error based on the GEC information, in response to identifying the error, using the error location to apply correction to the cache line segment having the error, and reconstructing data corresponding to the error using the locations of error-free segments as identified by the LED information for the segments.

2. The method of claim 1, further comprising coalescing a plurality of GEC updates, associated with adjacent cache lines, to be sent together.

3. The method of claim 1, wherein the error detection code is to identify the presence of an error and the location of the error within a cache line segment of the rank.

4. The method of claim 1, further comprising storing the LED information and the GEC information computed for the cache line segment of data at the cache line segment associated with the data.

5. The method of claim 1, further comprising storing the LED information and the GEC information computed for the cache line segment of data in a memory row different from a memory row associated with the data.

6. A method, comprising:
performing a local error detection (LED) in response to each memory read operation, based on an error detection code computed over a cache line segment, to detect an error location, at a given cache line segment, of an error at a chip-granularity among N data chips in a rank, along with locations of error-free segments;
performing a global error correction (GEC) over the cache line segment on the N data chips in the rank in response to detecting the error, the GEC based on an error correction code to generate GEC information; and
reconstructing data segments having the error by using the error location at the given cache line segment among the cache line segments to apply correction to the cache line segment having the error, and reconstructing data corresponding to the error, based on the locations of error-free segments as identified by the LED information for those segments, and the GEC information for those segments.

7. The method of claim 6, wherein a plurality of GEC updates to adjacent cache lines are coalesced and sent together.

8. The method of claim 6, wherein the error correction code is based on N cache line segments.

9. The method of claim 6, further comprising updating the GEC information in response to a write operation.

10. The method of claim 6, further comprising storing the GEC information in a row buffer of corresponding cache line, in a reserved region in each of the N data chips.

11. The method of claim 6, further comprising storing data and corresponding LED information on each chip of the rank, based on a physical data mapping policy; and providing the data and LED information in response to a cache line access request.

12. The method of claim 6, further comprising generating a tiered error correction code to protect the GEC information, wherein the tiered error correction code is stored on an $N^{th}$ chip and is to be used to recover the GEC information based on GEC information segments from a plurality of chips.

13. The method of claim 12, further comprising identifying an uncorrectable double-chip failure, based on detecting, during a GEC phase, an error in the GEC row of interest based on the tiered error correction code.

14. A memory controller to:
- verify data fidelity, in response to each memory read operation, based on local error detection (LED) information for a cache line segment of data associated with a rank of a memory;
- identify a presence and an error location, at a given cache line segment, of an error among cache line segments of the rank according to the LED information, along with locations of error-free segments;
- generate a global error correction (GEC) information for the cache line segment based on an error correction code; and
- correct the cache line segment having the error based on the GEC information, in response to identifying the error, using the error location at the given cache line segment among the cache line segments to apply correction to the cache line segment having the error, and reconstructing data corresponding to the error using the locations of error-free segments as identified by the LED information for those segments.

15. The memory controller of claim 14, wherein the LED and GEC information is mapped according to firmware information associated with the memory controller.

* * * * *